(12) United States Patent
Mauracher et al.

(10) Patent No.: US 9,136,099 B2
(45) Date of Patent: Sep. 15, 2015

(54) METHOD AND SUBSTRATES FOR FORMING CRYSTALS

(71) Applicant: Sony DADC Austria AG, Anif (AT)

(72) Inventors: Christoph Mauracher, Anif (AT); Werner Balika, Anif (AT); Andrew Naisby, Anif (AT)

(73) Assignee: Sony DADC Austria AG, Anif (AT)

( * ) Notice: Subject to any disclaimer, the term of this patent is extended or adjusted under 35 U.S.C. 154(b) by 0 days.

(21) Appl. No.: 13/834,827

(22) Filed: Mar. 15, 2013

(65) Prior Publication Data

US 2014/0008546 A1 Jan. 9, 2014

(30) Foreign Application Priority Data

Jul. 4, 2012 (EP) .................................. 12250131

(51) Int. Cl.
| | |
|---|---|
| *H01J 49/26* | (2006.01) |
| *H01J 49/16* | (2006.01) |
| *C30B 7/00* | (2006.01) |
| *B29C 45/00* | (2006.01) |
| *B29C 45/37* | (2006.01) |
| *C30B 7/02* | (2006.01) |
| *C30B 29/54* | (2006.01) |
| *H01J 49/04* | (2006.01) |

(52) U.S. Cl.
CPC .............. *H01J 49/164* (2013.01); *B29C 45/00* (2013.01); *B29C 45/372* (2013.01); *C30B 7/005* (2013.01); *C30B 7/02* (2013.01); *C30B 29/54* (2013.01); *H01J 49/0418* (2013.01); *Y10T 428/24355* (2015.01)

(58) Field of Classification Search
USPC .......................................... 250/281, 282, 288
See application file for complete search history.

(56) References Cited

U.S. PATENT DOCUMENTS

| | | | |
|---|---|---|---|
| 5,854,486 A * | 12/1998 | Dreyfus ........................ | 250/288 |
| 2002/0051738 A1 | 5/2002 | Schurenberg et al. | |
| 2004/0084615 A1* | 5/2004 | Schurenberg ................. | 250/288 |
| 2008/0231940 A1 | 9/2008 | Imanishi | |
| 2009/0178934 A1 | 7/2009 | Jarvius et al. | |

(Continued)

FOREIGN PATENT DOCUMENTS

| | | | |
|---|---|---|---|
| EP | 2 338 670 A1 | 6/2011 | |
| JP | 2625885 | 4/1997 | |

(Continued)

*Primary Examiner* — Nicole Ippolito
(74) *Attorney, Agent, or Firm* — Oblon, McClelland, Maier & Neustadt, L.L.P.

(57) ABSTRACT

A structured substrate is described which is suitable for forming and hosting a crystal array, as well as associated methods for making and using such a structured substrate. The structured substrate is made by injection molding and has on one side a combination of macro- and micro-structured features. Each macro-structured feature comprises an edge that forms a perimeter around an enclosed area containing a large number of the micro-structured features. When a droplet of a solution containing molecules of interest and a solvent is deposited onto one of the enclosed areas such that it extends somewhat beyond the perimeter, the droplet slowly dries and shrinks through evaporation of the solvent, during which the edge acts to seed crystallization of the molecules, and the micro-structured features act to direct crystal growth from the seed into the enclosed area. The crystal thus forms over the whole of the enclosed area in a shape that conforms to the perimeter. Crystals of a desired size and shape can therefore be formed.

19 Claims, 6 Drawing Sheets

(56) References Cited

U.S. PATENT DOCUMENTS

2009/0246470 A1  10/2009  Lucic et al.
2010/0089529 A1  4/2010  Barholm-Hansen et al.
2010/0176287 A1  7/2010  Ribbing et al.
2012/0028342 A1*  2/2012  Ismagilov et al. ......... 435/283.1

FOREIGN PATENT DOCUMENTS

| JP | 4274251 | 3/2009 |
| WO | 02/055199 A2 | 7/2002 |
| WO | 2005/033663 A2 | 4/2005 |

* cited by examiner

METHOD AND SUBSTRATES FOR FORMING CRYSTALS

FIELD OF THE DISCLOSURE

The disclosure relates to substrates having a surface which promotes crystals to form in pre-defined locations on the surface when droplets containing the molecules to crystallize are placed on the surface.

DESCRIPTION OF THE RELATED ART

Matrix-assisted laser desorption ionization (MALDI) is a well-known analysis technique by which molecules, often biological molecules such as proteins or DNA-fragments, are analyzed in a mass spectrometer or other scientific instrument. Commercial MALDI instruments are designed to accept a particular format of sample target which is formed by a substrate having a surface on which a large number of samples are arrayed at fixed positions, typically in a square grid. The MALDI instrument therefore "knows" where the samples are located once the target is arranged in the correct position in the instrument and can direct a laser beam accordingly to ablate and desorb each sample as desired.

The "matrix" of MALDI refers to the molecules which are chosen to have particularly suitable properties for hosting the analyte molecules (and for the subsequent laser ablation and desorption). The solid crystalline samples for the MALDI measurement are formed by mixing the matrix molecules and the analyte molecules in a solution with water and a solvent, and then spotting a droplet of the solution onto the substrate surface, after which the solvent gradually evaporates and the matrix and analyte molecules co-crystallize. This process can be automated with a liquid handling robot with a micro-pipetting head in conjunction with micro-titer plates to generate MALDI targets having arrays of samples.

For good crystal formation, it is generally accepted that a hydrophobic surface is desirable. However, a droplet placed on a hydrophobic surface will tend to wander during the drying, in which case the crystal will not be centered at the location where the droplet was first deposited. Since standard MALDI instruments assume the samples are arranged to conform with a pre-defined grid, this is not desirable.

U.S. 2002/0051738A1 discloses a solution to this problem. Small circular areas of hydrophilic surface are arranged in the generally hydrophobic surface, these hydrophilic areas being referred to in the art as "anchors" or "anchor points". Each anchor point is located at a node of the pre-defined grid for the sample array. Anchor points can be made in a variety of different ways. One known way to make the anchor points is by local plasma processing of the hydrophobic surface which transforms the exposed areas to become hydrophilic. To make the MALDI target, each droplet is deposited at an anchor point, which then ensures that as the droplet shrinks during the drying process it remains at the anchor point. The diameter of the anchor points is generally chosen to be several times smaller than the size of the droplet at the time of deposit of the droplet on the surface, e.g. 2-10 times smaller. The hydrophilic anchor points are sometimes made as bumps protruding from the hydrophobic substrate surface.

U.S. 2005/033663A2 discloses a later example of this general approach of using anchor points. Here, it is described that the hydrophilic anchor points can be made on a hydrophobic surface by exposing small areas of the surface to plasma treatment or by chemical treatment, such as with a solution or chemical etchant, by ozone treatment, or laser treatment. It is then explained that, regardless of the particular method chosen, the desired outcome is a step change in contact angle of the hydrophilic and hydrophobic surface portions, with it being suggested that the contact angle change should be at least 55-90 degrees.

WO 2002/055199 A2 also describes some background on MALDI target preparation and provides a comprehensive definition of "substrate" on pages 12 and 13, which we incorporate herein by reference not as a definition of substrate, but as a general disclosure of suitable properties and materials for substrates as envisaged herein. WO 2002/055199 A2 also includes a further description of substrates and their preparation starting on page 28, line 29.

U.S. 2009/0246470A1 describes how microstructured surface can be used to increase the hydrophobicity of a substrate surface or to stimulate smooth crystallization of microcrystals for MALDI target plates. A structure with elevations of between 1 nm and 100 μm is proposed, wherein various different shapes for the elevations are disclosed such as rectangular section bumps, square pyramids and sawtooth structures.

It is known to make MALDI targets from a variety of substrate materials, common examples being silicon, metal or metallized plastic. The substrate material is chosen for a variety of factors, such as: (i) its compatibility with patterning methods such as photolithography for making the anchor points, (ii) its ease of control of contact angle, and (iii) its compatibility with mass spectrometry.

SUMMARY

According to a first aspect of the disclosure, there is provided a method of forming a crystal array on a structured substrate comprising: providing a structured substrate having on one side a combination of macro-structured features and micro-structured features, each macro-structured feature comprising an edge that forms a perimeter around an enclosed area containing a large number of the micro-structured features; depositing on one of the enclosed areas a droplet of a solution containing molecules of interest and a solvent, wherein the volume of the solution deposited is controlled to ensure the droplet initially overfills the enclosed area to extend laterally beyond the perimeter onto adjacent surface portions; forming a crystal substantially confined to the enclosed area by allowing the droplet to dry and shrink through evaporation of the solvent, during which the edge acts to seed crystallization of the molecules at one or more locations on the perimeter and the micro-structured features act to direct crystal growth from the seed locations into the enclosed area; and repeating the depositing and crystal forming steps for each further enclosed area as desired.

The volume of solution is chosen so that, having regard to the contact angle of the substrate surface, it initially overfills the enclosed area somewhat. In particular, the volume can result in the droplet extending laterally beyond the perimeter onto adjacent surface portions such that the initial area covered by the droplet is at least 105%, 110%, 120%, 130% or 140% of the enclosed area, but no more than 150%, 160%, 170%, 180%, 190%, 200%, 210%, 220%, 230%, 240%, 250%, 300%, 400%, 500% or 600% of the enclosed area. Moreover, the initial area covered by the droplet should not extend to the perimeter of any adjacent enclosed areas.

For MALDI applications, the molecules will include molecules of first and second types, corresponding to matrix molecules and analyte molecules, which co-crystallize during the crystal forming step. The method may then further comprise: loading the structured substrate into a matrix-assisted laser desorption ionization (MALDI) instrument; and performing MALDI analysis on desired ones of the crystals.

In a preferred implementation, the macro- and micro-structured features are formed from a plastics material in an injection molding process. Other processes could also be used such as hot embossing or imprinting.

A particular advantage of the proposed combination of macro- and micro-structured features is that the crystals can be form reliably with a desired location, shape and size without the need to manufacture or treat the surface to vary the degree of hydrophobicity and hydrophilicity, i.e. contact angle, to control the droplet during the depositing and crystal forming steps. Namely, there is no need to incorporate abrupt changes of contact angle onto the surface to control the initial formation and subsequent growth of the crystal. In other words, there is no need to have a step change in contact angle either side of the edge. Specifically, the hydrophilic anchor point approach of the prior art is not required.

Plan view video micrographs taken during our experimental studies have shown that crystallization of the molecules initiates at distinct points on the edges. Typically, a crystal seed is seen at one distinct point, and then as time progresses a few more seed points appear one at a time. Each crystal seed is then seen to grow into the interior of the enclosed area. At some point the different crystals from the different seed points on the edge combine to form a single micro-crystalline body which fills the area defined by the edge and thus adopts the shape defined by the perimeter. Because the video micrographs are in plan view and because of limited resolution it is not clear exactly what initiates the crystal seeds or where they form in the vertical dimension. For example, in the case where the macro-structure feature is a step formed of an upper edge, side wall and lower edge, it is not certain whether the crystal seeds form on the upper edge or the lower edge. Moreover, it is not clear whether the precise points where the crystals seed are physical imperfections in the edge structure, such as jagged edges or points or just any point on the edge. However, what is clear from our experiments is that the crystals reliably seed from points on an edge and that the micro-structuring in the enclosed area somehow causes the crystals to grow inwards over the enclosed area, rather than outwards over the smooth, flat or unstructured upper surface.

The fact that the crystal can be made to form so as to fill the enclosed area and thereby adopt the shape defined by the perimeter is highly desirable and opens up new possibilities for sample configuration. For example, for MALDI, the location, shape and size of the crystal in plan view can be matched to the location, shape (e.g. oval) and size of the laser beam waist cross-section.

Compared with the anchor point approach a much greater degree of control is provided. With the proposed approach, the perimeter fixes the location and extent of the crystal, whereas with the anchor point approach the only control is that the anchor point defines where the crystal initially seeds. With the anchor point approach the lateral extent of the crystal is not controlled, and it cannot be guaranteed that the crystal will form centered on the anchor point. For example, the anchor point may end up at the edge of the crystal.

According to a second aspect of the disclosure, there is provided a method of making a structured substrate suitable for forming and hosting a crystal array, comprising: injection molding a plastics material to form the structured substrate having on one side a combination of macro- and micro-structured features, each macro-structured feature comprising an edge that forms a perimeter around an enclosed area containing a large number of the micro-structured features.

The structured substrate may further include an electrically conductive layer, for example a metal or metallic layer, deposited on the side of the structured substrate with the macro- and micro-structured features, for example by a suitable chemical or vapor deposition process.

Our experimental studies show that a wide variety of shapes and sizes of the micro-structured features display the desired crystal guiding properties. Specifically, the microfeatures may be depressions in or protrusions, or a combination of both.

According to a third aspect of the disclosure, there is provided a structured substrate suitable for forming and hosting a crystal array, wherein the structured substrate has on one side a combination of macro- and micro-structured features, each macro-structured feature comprising an edge that forms a perimeter around an enclosed area containing a large number of the micro-structured features. As previously mentioned, the macro- and micro-structured features can be formed in a plastics material, e.g. by injection molding, and an electrically conductive layer deposited on the macro- and micro-structured side. Moreover, the structured substrate does not require an abrupt change of contact angle either side of the perimeter.

In any of the above aspects of the disclosure, the enclosed areas have a shape in plan view selected from the group: circular, oval and polygonal, wherein polygonal may be square, rectangular, pentagonal, hexagonal, and wherein the corners of the polygons may be locally curved, and wherein rectangular enclosed areas may be elongate and hence channel shaped. For example, the enclosed areas may be substantially square with rounded corners in a "beer mat" cross-section.

In any of the above aspects of the disclosure, at least one lateral dimension of the micro-structured features is up to 3, 4 or 5 smaller than at least one lateral dimension of the macro-structured features. For example, at least one lateral dimension of the micro-structured features is between 2 and 4 orders of magnitude smaller than at least one lateral dimension of the macro-structured features. A lateral dimension for the micro-structured features may be diameter in the case of a circular cross-section pillar or pit. A micro-structured lateral dimension may be a width or a length in the case of a polygonal or arbitrarily shaped pillar or mesa structure, or in the case of a pit or depression of equivalent shape. A macro-structured feature lateral dimension may be diameter or width of the enclosed area.

In any of the above aspects of the disclosure, the micro-structured features can have a shape in plan view selected from the group: circular, oval, polygonal, arbitrary, wherein polygonal may be square, rectangular, pentagonal, hexagonal, and wherein the corners of the polygons may be locally curved, for example the micro-structured features may be substantially square pillars with rounded corners in a "beer mat" shape.

In any of the above aspects of the disclosure, the edges may be formed by a step, each step having at least one side wall. The sidewalls may be substantially vertical, i.e. 90±2 degrees to the plane of the upper surface where minus sign would indicate an overhang. However, in the case of injection molding—the preferred manufacturing technique—overhangs cannot be incorporated naturally, so substantially vertical is interpreted to mean 90-92 degrees. In other examples, particularly suited to injection molding, the sidewall may be inclined to the vertical, with angles lying between 60, 61, 62, 63, 64, 65, 66, 67, 68, 69 or 70 and 85, 86, 87 or 88 degrees (in a non-overhanging sense).

In some embodiments of the disclosure, the micro-structure features may be omitted according to which there is provided a method of forming a crystal array on a structured substrate comprising: providing a structured substrate having on one side an array of macro-structured features, each comprising an edge that forms a perimeter around an enclosed area; depositing on one of the enclosed areas a droplet of a solution containing molecules of interest and a solvent, wherein the volume of the solution deposited is controlled to ensure the droplet initially overfills the enclosed area to extend laterally beyond the perimeter onto adjacent surface portions; forming a crystal substantially confined to the enclosed area by allowing the droplet to dry and shrink through evaporation of the solvent, during which the edge acts to seed crystallization of the molecules at one or more locations on the perimeter; and repeating the depositing and crystal forming steps for each further enclosed area as desired. In these embodiments, the enclosed areas may be wells formed as a result of the edge being provided by a step down or plateaus formed as a result of the edge being provided by a step up. Alternatively the edge may be formed from a trough or rib that forms the perimeter of each enclosed area.

DETAILED DESCRIPTION

A structured substrate can be manufactured, if desired in large quantities, using an injection molding process as now described.

Figure 1:
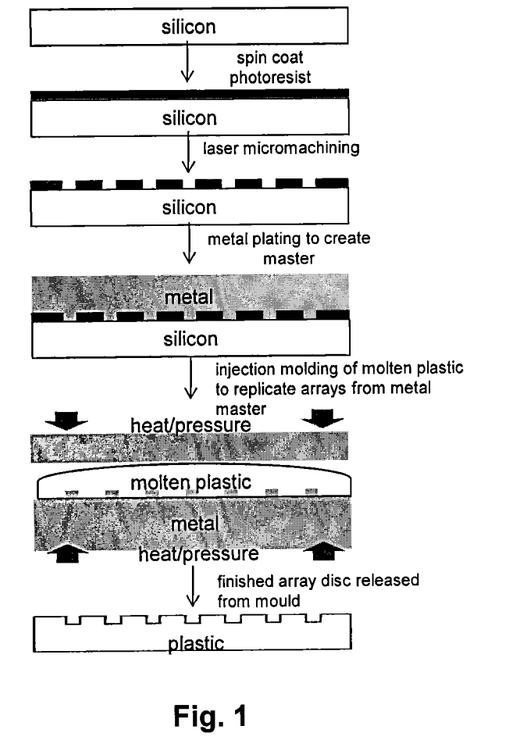
FIG. 1 shows the principal steps in a substrate manufacturing process.

FIG. 1 shows the principal steps in a substrate manufacturing process.

The first part of the process is to manufacture a master.

A silicon wafer is spin coated with a photoresist. An excimer laser or other suitable light source is then used to expose the photoresist to define a structure with high spatial resolution, for example by direct laser micromachining. The material to be exposed is transparent to the laser light used. However, in the focal volume of this highly focused laser beam chemical or physical modification is created. Ultimately a selective solubility of the exposed area relative to the surrounding is achieved. In a developer bath, depending on the used photosensitive material exposed or unexposed areas are removed. Thus, almost any 3D structures from a variety of photosensitive materials can be realized (i.e. SU-8). Alternative technologies for structuring the resist master are e-beam lithography or mask based lithography processes. Laser write Lithography can also be used with inorganic phase transition materials instead of the photoresist pushing the size resolution limit below the wavelength of the laser. Further details of applicable processes can be found in JP4274251 B2 (=U.S. 2008231940A1) and JP 2625885 B2 (no English equivalent). Once the photoresist has been suitably structured and the exposed (or non-exposed) material removed, a metal plating processing step is applied. Electroplating is used to deposit a nickel layer by electrolysis of nickel salt-containing aqueous solutions, so-called nickel electrolytes. Nickel electrolytes usually have nickel or nickel pellets as the anode. They serve the supply of metal ions. The process for the deposition of nickel has long been known and been highly optimized. Most nickel electrolytes to achieve an efficiency of >98%, which means that over 98% of the current supplied to be used for metal deposition. The remaining power is lost in unwanted electrolytic processes, such as hydrogen. The transcription of lithographically structured micro-features is strongly dependent on compliance with the correct parameters. The continuous supply of additives, but also the metal ion content and the temperature and the pH value needs to be.

This electroplating process can be repeated either to make multiple copies of the same master from the silicon or to create a negative copy from the first metal stamper that is produced from the silicon.

Direct milling into steel can be used as an alternative to silicon and photoresist in order to master such micro-structures.

Typical micro-structures are in the size of 500 nm to several micrometers.

The master is then used in an injection molding process to create the macro- and micro-structured surface features in polymer. In an injection molding machine, polymers are plasticized in an injection unit and injected into a mold. The cavity of the mold determines the shape and surface texture of the finished part. The polymer materials need to be treated carefully to prevent oxidation or decomposition as a result of heat or sheer stresses. Heat and pressure are applied to press molten polymer onto the structured surface of the master. After a suitable filling, cooling and hardening time, the finished structure is ejected from the mold. The surface quality of the component can be selected almost arbitrarily enabling a wide variety of macro- and micro-structured features to be made.

The cost of the master and the larger molding tool it will form a part of represents a large part of the total necessary investment, so the process lends itself to high volumes. Simple tools enable economic viable prototyping from a threshold of a few thousand parts. Tools for production can be used up to make up to several million parts.

Suitable polymers for the container include: polystyrene (PS), polypropylene (PP), polyethylene (PE), cycloolefin (co-) polymer (COP), styrene-acrylonitrile copolymer (SAN), polyamide (nylon), polyimide (PI), polycarbonate (PC), and polymethyl methacrylate (PMMA).

Experimental results of spotting onto various test structured substrates are now discussed.

In all test structures, the substrates were made of COP and had no coating. Of the 16 different test structures, all had circular enclosed areas of diameter 1.55 mm which are wells recessed in the substrate's upper surface. The perimeter is formed by a step down from the upper surface to the micro-structured lower surface that forms a base to the well. The height of the step was approximately 2 µm and the sidewall of the step was close to vertical. The test structures differ in their micro-structure features. The perimeter diameters were 1.55 mm.

The test wells were made in complementary pairs, with one of each pair being according to the disclosure and having a step forming an edge (referred to internally as A22) and the other of each pair, i.e. the control, not having a step (referred to internally as A11). In each pair, the micro-structure features, if present, are the same and cover the same area. Both in the examples according to the disclosure and in the control examples, the surface outside the microstuctured area is smooth and featureless. In other words, for the examples according to the disclosure, the surface portion radially outside the enclosed area, radially beyond the perimeter, is unstructured.

Figure 2:
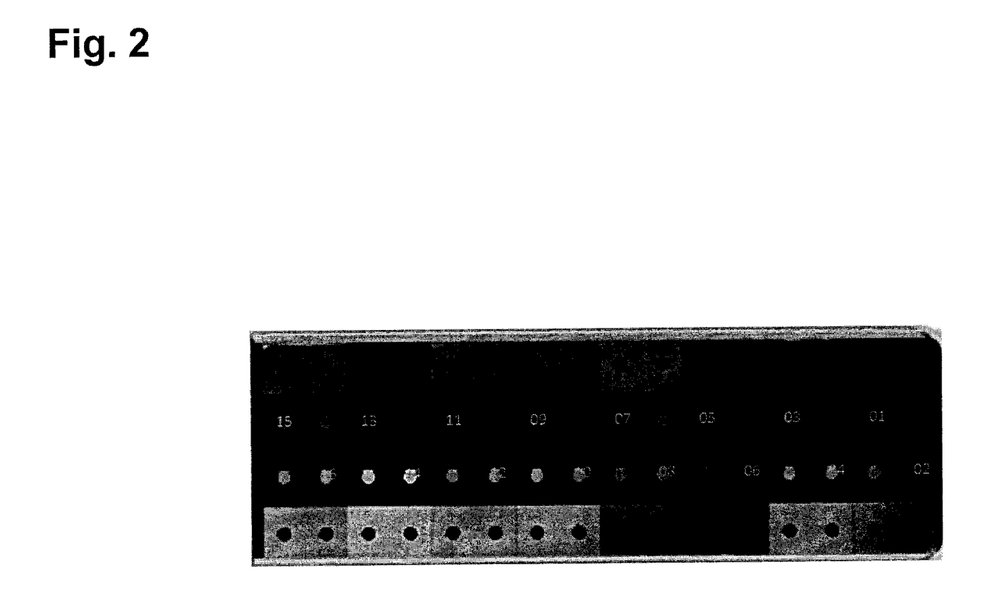
FIG. 2 shows a test slide which has four rows of test wells.

FIG. 2 shows a test slide which has four rows of test wells. The top and bottom rows are A11 wells and the middle two rows are A22 wells. The complimentary pairs are between vertically adjacent wells. It is noted that two of the test wells (#01 and #13) in the second row had no micro-structure features.

In each test well, crystallization was carried out with three different droplet volumes, namely 5, 10 and 15 microliters.

In all cases, drying was carried out at room temperature and at least 20 minutes was allowed.

Before testing, each test well was imaged twice in plan view with a scanning electron microscope (SEM), once at low resolution (×45) to view the whole well, and once at high resolution (×5000) to image the micro-structure. After crystal formation, each test well was imaged again at the low resolution to show the crystal. For each test well, there are therefore 5 images in total, since for each test well crystal formation was carried out using three different droplet volumes as already mentioned.

FIGS. 3, 4, 5 and 6 show SEM images from the tests for the 16 test wells where the numbering follows that shown in FIG. 2. Each figure shows four test wells, one per column, with the 5 images per test well being arranged in 5 rows.

In the tests where the crystal has not formed centered on its well, the crystal images are labeled "Spot outside well" which is referred to as a failure in the following. As mentioned well #01 (FIG. 3, column 4) and well #13 (FIG. 4, column 2) are control examples with no micro-structure.

Figure 3:
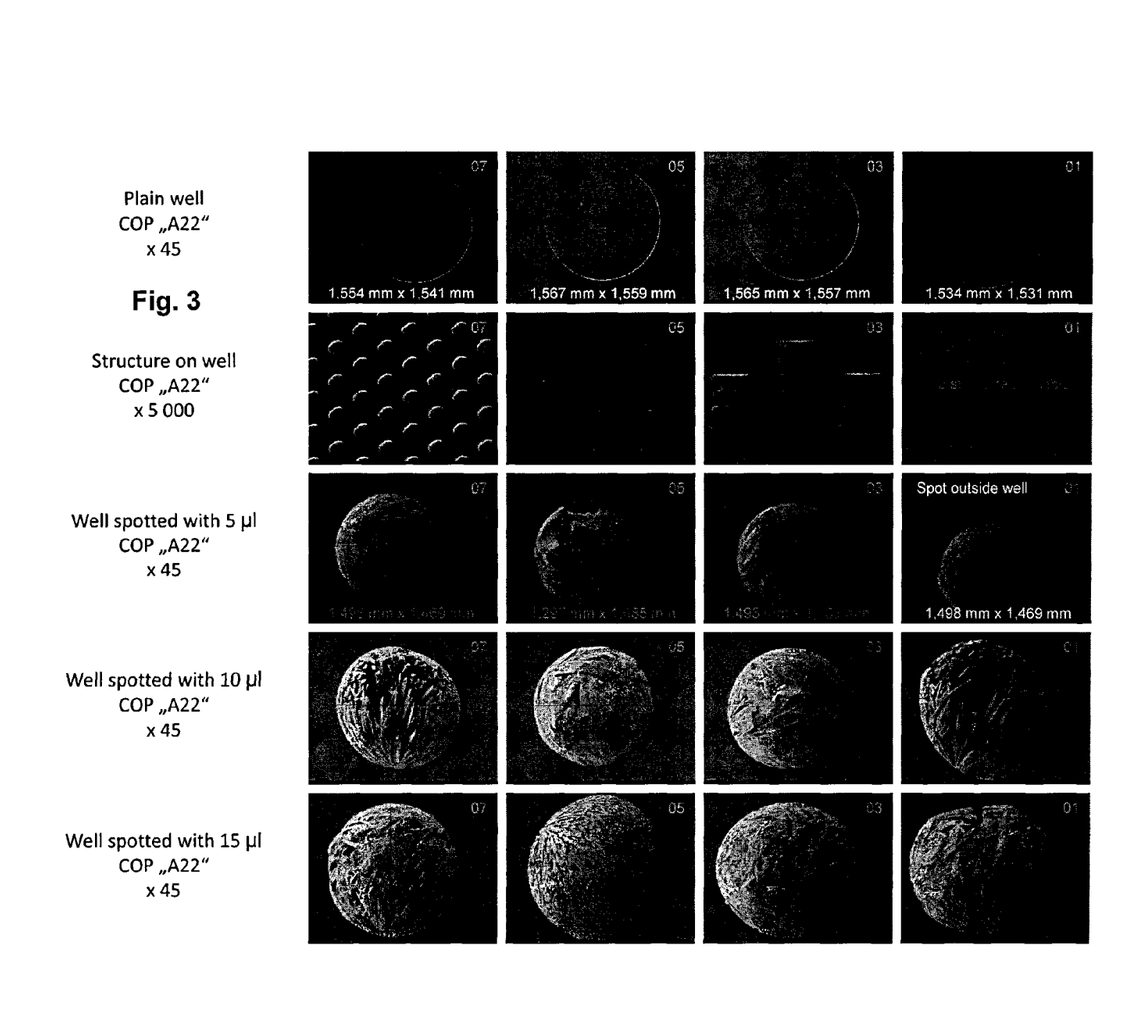
FIGS. 3 to 6 show SEM images from the tests for 16 test wells, where the numbering follows from FIG. 2, and each column of images is specific to one test well.

For control well #01, the crystal formed with the 5 µl droplet is approximately circular and centered on a location on the side wall of the well indicating that the crystal seeded at one point on the side wall and then spread out substantially equally in all directions (isotropically).

Figure 4:
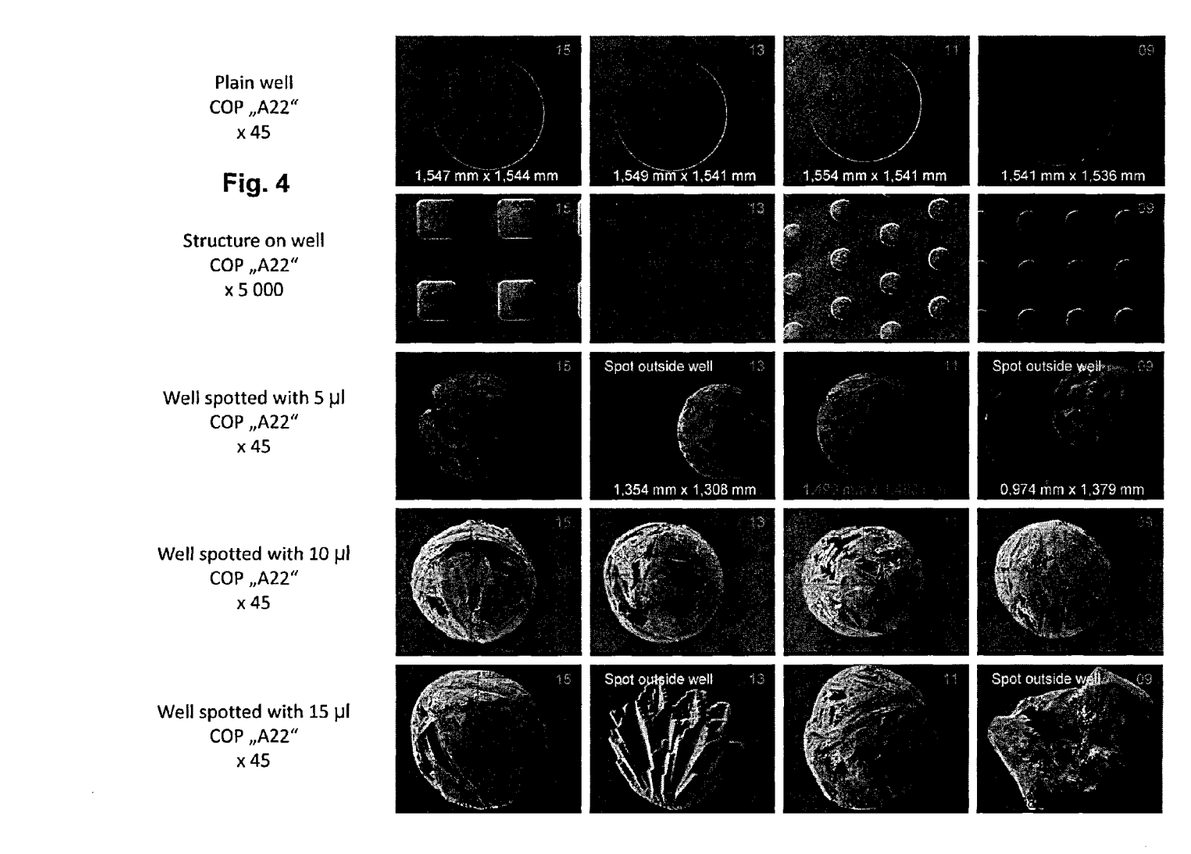
Figure 5:
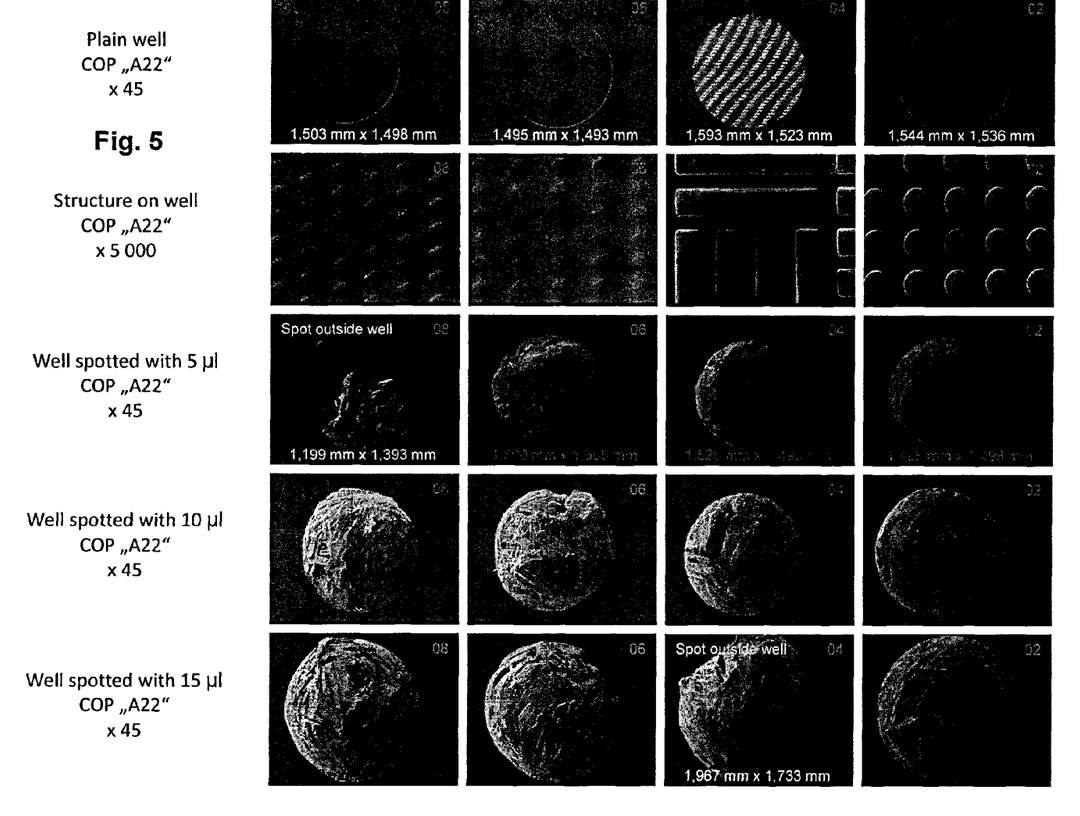
Figure 6:
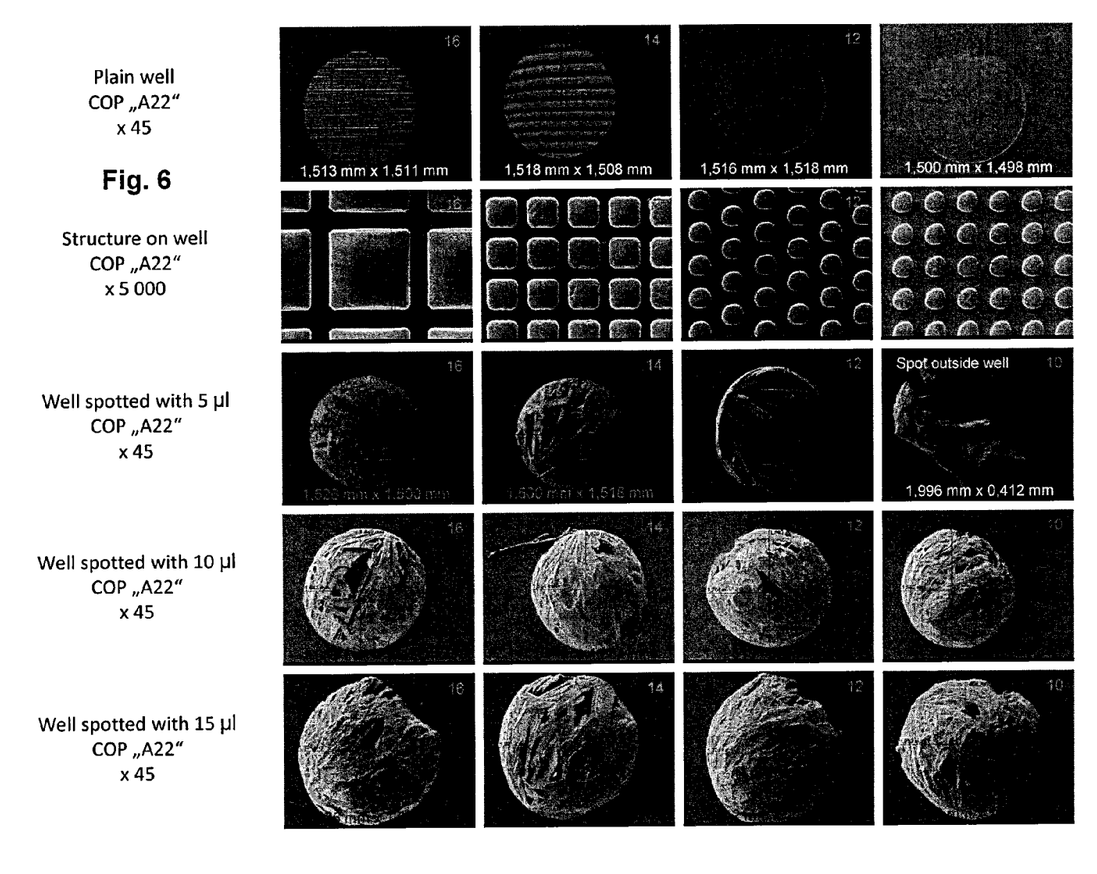

For control well #13, the crystal formed with the 5 µl droplet is approximately circular but has formed only tangentially touching the side wall of the well indicating that the crystal seeded at one point on the side wall and then spread out away from the well. Although not visible clearly from the reproduction of the image shown in the figure, the crystal formed with the 15 µl droplet is also not matched to the well. For this test, it seems the crystal seeded predominantly from the point at the bottom of the image which is a point distant from the edge of the well on the upper surface.

Looking at the images as a whole, it can be seen that most of the test wells, for most droplet volumes, resulted in crystal formation that conforms to the sidewalls of the well. There are 3 failures out of 14 test wells with the 5 µl droplet, no failures with the 10 µl droplet and 3 failures with the 15 µl droplet. In all of the tests with the larger droplet sizes of 10 µl and 15 µl, the crystal diameters exceed the well diameter, typically by 0.1-0.3 mm for the 10 µl droplets and 0.3-0.5 mm for the 15 µl droplets. For the tests with the 5 µl droplets, the crystals are confined to conform with the wells in 10 out of 14 test wells (including test well #15 which has one dimension very slightly above the well diameter), whereas 3 out of 14 failed to form circular crystals in the well (#08. #09 and #10) and 1 out of 14 (#12) formed a generally circular crystal in the well which extended slightly beyond the sidewalls.

The dimensions and shapes of the micro-structure features and their mutual separation distance does not appear to have any simple direct effect on the crystallization guiding effect of the micro-structured surface. However, it is clear that a wide variety of micro-structures display the effect. Absent a detailed physico-chemical understanding of the crystallization process, empirical testing can be used to establish which micro-structures produce good results. It may be the case that particular micro-structures may have better performance for particular molecules or molecule combinations, for example. Similarly, performance may be sensitive to droplet size, well depth and other parameters.

In the test examples shown the edge which is active to provide a seed for crystallization is formed by a step down into a microstructured well. Other structures will also provide a suitable edge, for example: a step up to a microstructured plateau; an edge or pair of edges formed by a trough or moat; or an edge or pair of edges formed by a rib. Moreover, the troughs or ribs could be of various cross-section such as square, rectangular or triangular.

The vertical height associated with the perimeter feature, e.g. the height of the step, height of the rib, or the depth of the trough can be over a wide range, for example values of as low as 100, 200, 300, 400 or 500 nm could be used, and values as high as 1, 2, 3, 4, 5, 6, 7, 8, 9 or 10 micrometers could be used.

CROSS-REFERENCE TO RELATED APPLICATIONS

The present application claims priority of EP patent application No. 12 250 131.5 filed on 4 Jul. 2012, the entire contents of which are incorporated herein by reference.

The invention claimed is:

1. A method of forming a crystal array on a structured substrate comprising:
   providing a structured substrate having on one side a combination of macro-structured features and micro-structured features, each macro-structured feature comprising an edge that forms a perimeter around an enclosed area containing a large number of the micro-structured features,
   wherein the micro-structured features are depressions, protrusions or a combination of depressions and protrusions;
   depositing on one of the enclosed areas a droplet of a solution containing molecules of interest and a solvent, wherein the volume of the solution deposited is controlled to ensure the droplet initially overfills the enclosed area to extend laterally beyond the perimeter onto adjacent surface portions,
   forming a crystal substantially confined to the enclosed area by allowing the droplet to dry and shrink through evaporation of the solvent, during which the edge acts to seed crystallization of the molecules at one or more locations on the perimeter and the micro-structured features act to direct crystal growth from the seed locations into the enclosed area; and
   repeating the depositing and crystal forming steps for each further enclosed area as desired.

2. The method of claim 1, wherein the molecules include molecules of first and second types which co-crystallize during the crystal forming step, and the method further comprises:
   loading the structured substrate into a matrix-assisted laser desorption ionization (MALDI) instrument; and
   performing MALDI analysis on desired ones of the crystals.

3. The method of claim 1, wherein the macro- and micro-structured features are formed from a plastics material in one of an injection molding process, a hot embossing process and an imprinting process.

4. The method of claim 1, wherein there is no abrupt change of contact angle either side of the edge.

5. The method of claim 1, wherein the crystal is formed so as to fill the enclosed area and thereby adopts the shape defined by the perimeter.

6. The method of claim 1, wherein the micro-structured features have a size of 500 nm to several micrometers.

7. The method of claim 1, wherein the initial area covered by the of the solution deposited is 105% to 400% of the enclosed area.

8. The method of claim 1, wherein
the micro-structured features have a size of 500 nm to several micrometers, and
the initial area covered by the of the solution deposited is 105% to 400% of the enclosed area.

9. A method of making a structured substrate suitable for forming and hosting a crystal array, comprising:
injection molding a plastics material to form the structured substrate having on one side a combination of macro- and micro-structured features, each macro-structured feature comprising an edge that forms a perimeter around an enclosed area containing a large number of the micro-structured features,
wherein the micro-structured features are depressions, protrusions or a combination of depressions and protrusions.

10. The method of claim 9, wherein there is no method step for creating abrupt changes of contact angle either side of the edges.

11. The method of claim 9 wherein the structured substrate further includes an electrically conductive layer deposited on the side of the structured substrate with the macro- and micro-structured features.

12. The method of claim 9, wherein the enclosed areas have a shape in plan view selected from the group: circular, oval and polygonal, wherein polygonal may be square, rectangular, pentagonal, hexagonal, and wherein the corners of the polygons may be locally curved, and wherein rectangular enclosed areas may be elongate and hence channel shaped.

13. The method of claim 9, wherein the micro-structured features have a size of 500 nm to several micrometers.

14. A structured substrate suitable for forming and hosting a crystal array, wherein the structured substrate has on one side a combination of macro- and micro-structured features, each macro-structured feature comprising an edge that forms a perimeter around an enclosed area containing a large number of the micro-structured features,
wherein the micro-structured features are depressions, protrusions or a combination of depressions and protrusions.

15. The structured substrate of claim 14, wherein the macro- and micro-structured features are formed in a plastics material.

16. The structured substrate of claim 14, further including an electrically conductive layer deposited on the macro- and micro-structured side.

17. The structured substrate of claim 14, wherein there is no abrupt change of contact angle either side of the edges.

18. The structured substrate of claim 14, wherein the enclosed areas have a shape in plan view selected from the group: circular, oval and polygonal, wherein polygonal may be square, rectangular, pentagonal, hexagonal, and wherein the corners of the polygons may be locally curved, and wherein rectangular enclosed areas may be elongate and hence channel shaped.

19. The structured substrate of claim 14, wherein the micro-structured features have a size of 500 nm to several micrometers.

* * * * *